US010312121B2

(12) United States Patent
Musselman et al.

(10) Patent No.: US 10,312,121 B2
(45) Date of Patent: Jun. 4, 2019

(54) SYSTEMS AND METHODS FOR ALIGNING MEASUREMENT DEVICE IN SUBSTRATE PROCESSING SYSTEMS

(71) Applicant: LAM RESEARCH CORPORATION, Fremont, CA (US)

(72) Inventors: Marcus Musselman, Oakland, CA (US); Andrew D. Bailey, III, Pleasanton, CA (US); Dmitry Opaits, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/446,543

(22) Filed: Mar. 1, 2017

(65) Prior Publication Data

US 2017/0287753 A1   Oct. 5, 2017

Related U.S. Application Data

(60) Provisional application No. 62/314,651, filed on Mar. 29, 2016.

(51) Int. Cl.
*H01L 21/67* (2006.01)
*H01L 21/687* (2006.01)
*H01L 21/68* (2006.01)

(52) U.S. Cl.
CPC ...... *H01L 21/67259* (2013.01); *H01L 21/681* (2013.01); *H01L 21/68735* (2013.01); *H01L 21/68742* (2013.01)

(58) Field of Classification Search
CPC ............... H01J 37/32642; H01J 37/321; H01J 37/32082; H01J 37/32174;
(Continued)

(56) References Cited

U.S. PATENT DOCUMENTS 5,660,673 A   8/1997   Miyoshi
5,762,714 A   6/1998   Mohn et al.
(Continued)

FOREIGN PATENT DOCUMENTS

CN   102243977 A       11/2011
JP   2015201552 A  *  11/2015   ............... H05H 1/46
(Continued)

OTHER PUBLICATIONS

MP125E N-470 Linear Drive User Manual; Version 1.1.0; Date Sep. 18, 2014; 54 Pages; Physik Instrumente (PI) GmbH & Co. KG, Auf der Roemerstr. 1, 76228 Karlsruhe, Germany.
(Continued)

*Primary Examiner* — Isiaka O Akanbi

(57) ABSTRACT

A substrate support in a substrate processing system includes an inner portion arranged to support a substrate, an edge ring surrounding the inner portion, and a controller. The controller, to selectively cause the edge ring to engage the substrate and tilt the substrate, controls at least one actuator to at least one of raise and lower the edge ring and raise and lower the inner portion of the substrate support. The controller determines an alignment of a measurement device in the substrate processing system based on a signal reflected from a surface of the substrate when the substrate is tilted.

14 Claims, 5 Drawing Sheets

(58) Field of Classification Search
CPC ......... H01L 21/67259; H01L 21/68735; H01L 21/68764; H01L 21/68742; G01B 11/272
USPC .......................................... 356/138, 399–401
See application file for complete search history.

(56) References Cited

U.S. PATENT DOCUMENTS

| | | |
|---|---|---|
| 6,022,809 A | 2/2000 | Fan |
| 6,044,534 A | 4/2000 | Seo et al. |
| 6,206,976 B1 | 3/2001 | Crevasse et al. |
| 6,589,352 B1 | 7/2003 | Yudovsky et al. |
| 6,744,212 B2 | 6/2004 | Fischer et al. |
| 6,896,765 B2 | 5/2005 | Steger |
| 6,898,558 B2 | 5/2005 | Klekotka |
| 7,968,469 B2 | 6/2011 | Collins et al. |
| 8,999,106 B2 | 4/2015 | Liu et al. |
| 9,011,637 B2 | 4/2015 | Yamamoto |
| 9,142,391 B2 | 9/2015 | Yamamoto |
| 2002/0072240 A1 | 6/2002 | Koike |
| 2003/0201069 A1 | 10/2003 | Johnson |
| 2004/0053428 A1 | 3/2004 | Steger |
| 2004/0149389 A1 | 8/2004 | Fink |
| 2008/0223873 A1 | 9/2008 | Chen et al. |
| 2008/0236749 A1 | 10/2008 | Koshimizu et al. |
| 2009/0056629 A1 | 3/2009 | Katz et al. |
| 2009/0067954 A1 | 3/2009 | Lanee et al. |
| 2009/0197423 A1* | 8/2009 | Koshimizu ....... H01J 37/32009 438/719 |
| 2010/0025369 A1* | 2/2010 | Negishi ............. H01J 37/32642 216/60 |
| 2011/0031111 A1* | 2/2011 | Kobayashi ........ H01J 37/32623 204/192.34 |
| 2011/0287631 A1 | 11/2011 | Yamamoto |
| 2012/0305184 A1 | 12/2012 | Singh et al. |
| 2013/0106286 A1 | 5/2013 | Banna et al. |
| 2013/0157388 A1* | 6/2013 | Grimbergen ............ H01L 22/12 438/9 |
| 2014/0213055 A1 | 7/2014 | Himori et al. |
| 2014/0273460 A1* | 9/2014 | Reyland ........... H01L 21/68735 438/694 |
| 2015/0181684 A1 | 6/2015 | Banna et al. |
| 2016/0211165 A1 | 7/2016 | McChesney et al. |
| 2016/0211166 A1 | 7/2016 | Yan et al. |
| 2017/0018407 A1* | 1/2017 | Kondo ..................... H05H 1/46 |

FOREIGN PATENT DOCUMENTS

| | | |
|---|---|---|
| TW | 506234 B | 10/2002 |
| TW | 201207933 A | 2/2012 |
| TW | 201324653 A | 6/2013 |
| TW | 201436089 A | 9/2014 |

OTHER PUBLICATIONS

First Office Action dated Dec. 29, 2017 corresponding to Chinese Patent Application No. 201610032252.1, 12 pages.

* cited by examiner

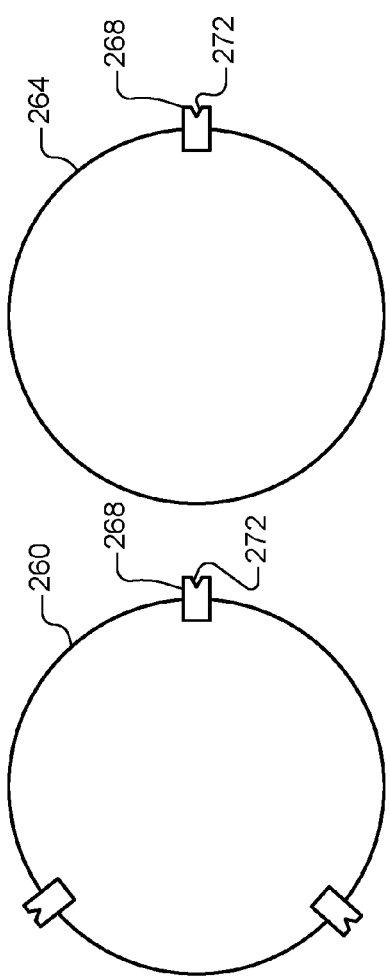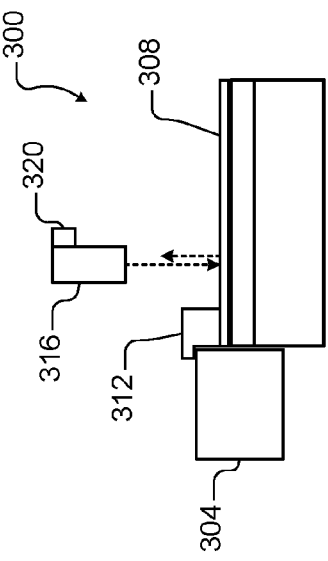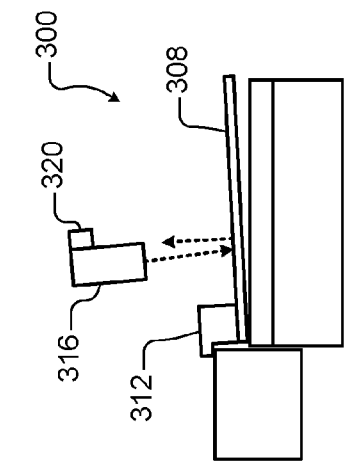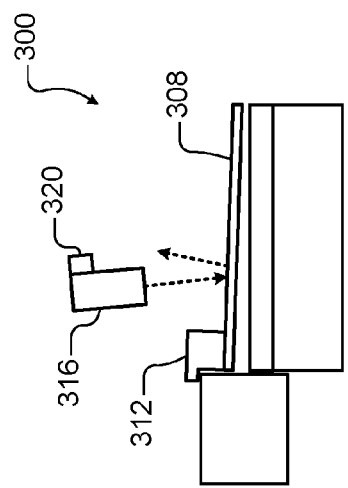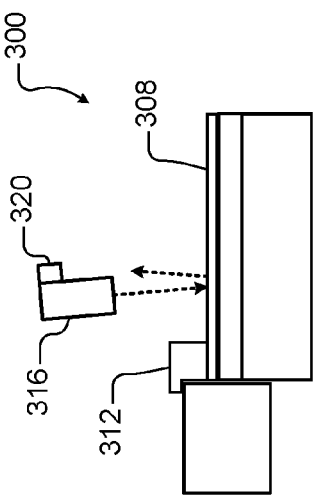

SYSTEMS AND METHODS FOR ALIGNING MEASUREMENT DEVICE IN SUBSTRATE PROCESSING SYSTEMS

CROSS-REFERENCE TO RELATED APPLICATIONS

This application claims the benefit of U.S. Provisional Application No. 62/314,651, filed on Mar. 29, 2016.

The present disclosure is related to U.S. Provisional Application with 15/403,786 US entitled "SYSTEMS AND METHODS FOR PERFORMING EDGE RING CHARACTERIZATION" filed herewith, which claims the benefit of U.S. Provisional Application No. 62/314,659, filed on Mar. 29, 2016. The entire disclosures of the applications referenced above are incorporated herein by reference.

FIELD

The present disclosure relates to systems and methods for measuring an edge ring in a substrate processing system.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

A substrate processing system may be used to etch film on a substrate such as a semiconductor wafer. The substrate processing system typically includes a processing chamber, a gas distribution device and a substrate support. During processing, the substrate is arranged on the substrate support. Different gas mixtures may be introduced into the processing chamber and radio frequency (RF) plasma may be used to activate chemical reactions.

The substrate processing chamber may include a measurement device (e.g., a spectral reflectometer, such as a laser spectral reflectometer, or LSR, or another light measurement device) positioned to measure various characteristics of a substrate arranged on the substrate support. For example, the measurement device may be positioned directly above the substrate support to direct a signal downward at the substrate. A sensing device (e.g., a charge-coupled device, or CCD, a photodiode, etc.) is arranged to sense the signal reflected from the surface of the substrate. Characteristics of the reflected signal are indicative of various characteristics of the substrate.

SUMMARY

A substrate support in a substrate processing system includes an inner portion arranged to support a substrate, an edge ring surrounding the inner portion, and a controller. The controller, to selectively cause the edge ring to engage the substrate and tilt the substrate, controls at least one actuator to at least one of raise and lower the edge ring and raise and lower the inner portion of the substrate support. The controller determines an alignment of a measurement device in the substrate processing system based on a signal reflected from a surface of the substrate when the substrate is tilted.

A method for determining alignment of a measurement device in a substrate processing system includes arranging a substrate on an inner portion of a substrate support and selectively causing an edge ring arranged around the inner portion of the substrate support to engage the substrate and tilt the substrate by at least one of raising and lowering the edge ring and raising and lowering the inner portion of the substrate support. The method further includes determining the alignment of the measurement device based on a signal reflected from a surface of the substrate when the substrate is tilted.

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIGS. 4A and 4B are plan views of example test substrates according to the present disclosure;

FIGS. 5A, 5B, 5C, and 5D illustrate example positions of a test substrate and an LSR device according to the present disclosure.

In the drawings, reference numbers may be reused to identify similar and/or identical elements.

DETAILED DESCRIPTION

Figure 1:
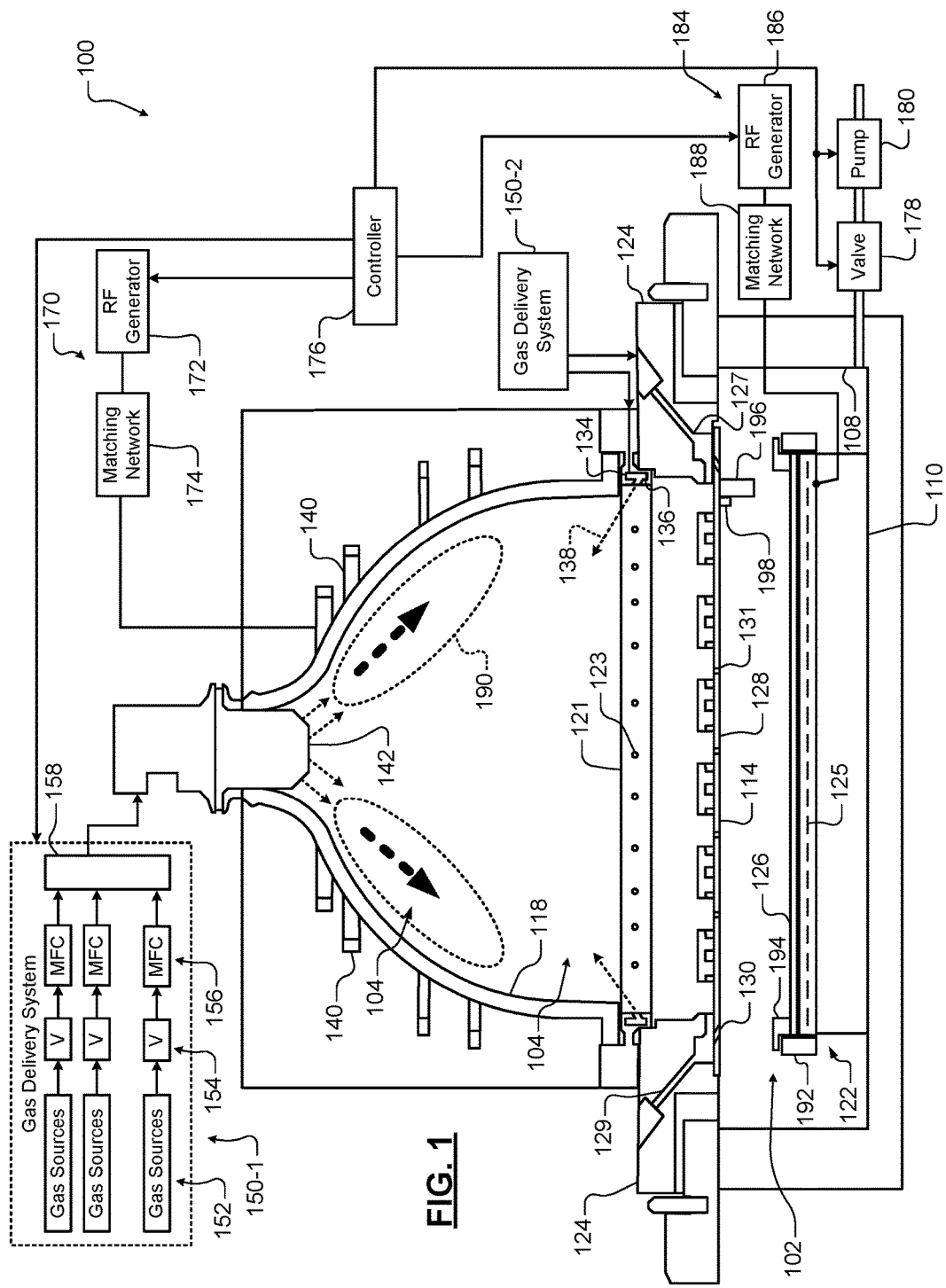
FIG. 1 is a functional block diagram of an example processing chamber according to the present disclosure.

A substrate processing chamber may include a measurement device (e.g., a light measurement device such as a spectral reflectometer, or SR, a laser spectral reflectometer, or LSR, etc.) positioned to measure various characteristics of a substrate (e.g., a wafer) arranged on the substrate support. For example, the SR may be positioned directly above the substrate support to direct an SR signal downward at the substrate. A photodiode, CCD, or other sensing device is arranged to sense the SR signal reflected from the surface of the substrate. Characteristics of the reflected SR signal are indicative of various characteristics of the substrate.

When the SR is properly aligned (i.e., has a desired orientation relative to the substrate support), a vector in the direction of the SR signal propagation toward the substrate is aligned with (i.e., parallel to) a normal vector of the surface of the substrate support or substrate, and a signal intensity of the SR signal is optimal. An optimal signal intensity as used herein may correspond to a maximum signal intensity, a signal intensity within a desired range, etc. However, the SR may not be perfectly aligned or may be shifted out of alignment over time. Accordingly, an actual signal intensity of the SR signal may differ from a desired signal intensity.

As used herein, an optimal signal refers to an SR signal having desired characteristics as predetermined or calibrated according to user specifications, substrate specifications, process specifications, chamber specifications, etc. For example, SR signal amplitudes relative to wavelength may have a known relationship (e.g., as determined via modeling, experimentation, etc.) with respect to an angle between the normal vector of the test substrate and the vector in the direction of the SR signal propagation. Accordingly, a given process or process step may have an associated optimal alignment based on the known relationship. The optimal alignment may not necessarily correspond to a minimum or maximum signal amplitude or a particular angle of incidence. For example, optimal alignment may correspond to a desired range of alignments associated with a relationship between the signal amplitude and the angle of incidence. In one example only, the optimal signal may correspond to a signal having a maximum signal amplitude within a desired angle of incidence range.

A substrate support in a substrate processing chamber may include an edge ring for confining plasma to a volume above the substrate, protecting the substrate support from erosion caused by the plasma, etc. For example, the edge ring may be arranged to control characteristics of a plasma sheath near and around the substrate and the edge ring to achieve a desired critical dimension uniformity (CDU).

Systems and methods according to the principles of the present disclosure implement a moveable/adjustable edge ring (and/or an adjustable substrate support, chuck, pedestal, etc.) and a test or dummy substrate to determine alignment (e.g., misalignment direction and magnitude) of the SR and optimize (e.g., adjust intensity of) the SR signal accordingly. For example, the edge ring may be moveable using, for example, one or more pins and associated actuators (e.g., a three degree of freedom, or 3DOF, parallel robot) for independently raising and lowering respective portions of the edge ring. The test substrate includes one or more contact fingers arranged around and extending outward from an edge of the test substrate.

An effective diameter of the test substrate (e.g., as defined by outer ends of the contact fingers) is greater than an inner diameter of the edge ring. Accordingly, the contact fingers contact an upper surface of the edge ring. In this manner, raising and lowering the edge ring correspondingly raises and lowers the test substrate, and the pins may be independently controlled to achieve a desired orientation (e.g., height, tilt, etc.) of the edge ring relative to the test substrate. In examples including an adjustable substrate support, the substrate support may be lowered to cause the contact fingers to contact the edge ring in a similar manner. In examples where the test substrate includes only one contact finger, the test substrate may be positioned (e.g., rotationally) such that the contact finger is aligned with a desired portion of the edge ring. Accordingly, raising the edge ring to engage the contact finger will cause the substrate to tilt differently based on characteristics of the edge ring at that position.

Accordingly, the edge ring may be used to selectively adjust the orientation of the test substrate (e.g., whether the test substrate is substantially flat, is tilted at a specific angle, etc.) relative to the substrate support and the SR. Adjusting the orientation of the test substrate in turn adjusts the normal vector of the test substrate and the resulting intensity of the SR signal reflected from the surface of the test substrate. The reflected SR signal may indicate the angle at which the normal vector of the test substrate and the vector in the direction of the SR signal propagation toward and/or away from the test substrate are substantially aligned. For example, the reflected SR signal may indicate that the respective vectors are aligned when the test substrate is flat relative to the substrate support (i.e., parallel to an upper surface of the substrate support), or when the test substrate is tilted at a particular angle.

In this manner, systems and methods described herein are configured to selectively adjust the orientation of the test substrate, monitor signal intensities of the SR signal for various positions of the test substrate and determine the position of the test substrate corresponding to the optimal signal intensity for the SR signal. The position corresponding to the optimal signal intensity can then be used to calculate the direction and magnitude that the SR is misaligned with the substrate support (i.e., the direction and magnitude of misalignment between the normal vector of the substrate support and the vector in the direction of SR signal propagation toward the substrate support). During processing of a substrate arranged on the substrate support, the SR signal can be adjusted to compensate for the misalignment and achieve a desired signal intensity. In examples where the SR is configured to be aligned using mechanical methods (e.g., via thumbscrews or other alignment mechanisms), the alignment of the SR can be adjusted according to the calculated misalignment. Although described herein as an SR signal, the principles of the present disclosure may be implemented with other suitable types of measurement signals.

Referring now to FIG. 1, an example of a substrate processing chamber 100 for etching a layer (for example only, a tungsten, or W, layer) of a substrate according to the present disclosure is shown. While a specific substrate processing chamber is shown and described, the methods described herein may be implemented on other types of substrate processing systems.

The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114.

The upper chamber region 104 is defined by an upper surface of the gas distribution device 114 and an inner surface of a dome 118. In some examples, the dome 118 rests on a first annular support 121. In some examples, the first annular support 121 includes one or more spaced holes 123 for delivering process gas to the upper chamber region 104, as will be described further below. In some examples, the process gas is delivered by the one or more spaced holes 123 in an upward direction at an acute angle relative to a plane including the gas distribution device 114, although other angles/directions may be used. In some examples, a gas flow channel 134 in the first annular support 121 supplies gas to the one or more spaced holes 123.

The first annular support 121 may rest on a second annular support 124 that defines one or more spaced holes 127 for delivering process gas from a gas flow channel 129 to the lower chamber region 102. In some examples, holes 130 in the gas distribution device 114 align with the holes 127. In other examples, the gas distribution device 114 has a smaller diameter and the holes 130 are not needed. In some examples, the process gas is delivered by the one or more spaced holes 127 in a downward direction towards the substrate at an acute angle relative to the plane including the gas distribution device 114, although other angles/directions may be used.

In other examples, the upper chamber region 104 is cylindrical with a flat top surface and one or more flat inductive coils may be used. In still other examples, a single chamber may be used with a spacer located between a showerhead and the substrate support.

A substrate support 122 is arranged in the lower chamber region 102. In some examples, the substrate support 122 includes an electrostatic chuck (ESC), although other types of substrate supports can be used. A substrate 126 is arranged on an upper surface of the substrate support 122 during etching. In some examples, a temperature of the substrate 126 may be controlled by a heater plate 125, an optional cooling plate with fluid channels, and one or more sensors (not shown), although any other suitable substrate support temperature control system may be used.

In some examples, the gas distribution device 114 includes a showerhead (for example, a plate 128 having a plurality of spaced holes 131). The plurality of spaced holes 131 extend from the upper surface of the plate 128 to the lower surface of the plate 128. In some examples, the spaced holes 131 have a diameter in a range from 0.4" to 0.75" and the showerhead is made of a conducting material such as aluminum or a non-conductive material such as ceramic with an embedded electrode made of a conducting material.

One or more inductive coils 140 are arranged around an outer portion of the dome 118. When energized, the one or more inductive coils 140 create an electromagnetic field inside of the dome 118. In some examples, an upper coil and a lower coil are used. A gas injector 142 injects one or more gas mixtures from a gas delivery system 150-1.

In some examples, a gas delivery system 150-1 includes one or more gas sources 152, one or more valves 154, one or more mass flow controllers (MFCs) 156, and a mixing manifold 158, although other types of gas delivery systems may be used. A gas splitter (not shown) may be used to vary flow rates of a gas mixture. Another gas delivery system 150-2 may be used to supply an etch gas or an etch gas mixture to the gas flow channels 129 and/or 134 (in addition to or instead of etch gas from the gas injector 142).

Suitable gas delivery systems are shown and described in commonly assigned U.S. patent application Ser. No. 14/945,680, entitled "Gas Delivery System" and filed on Dec. 4, 2015, which is hereby incorporated by reference in its entirety. Suitable single or dual gas injectors and other gas injection locations are shown and described in commonly assigned U.S. Provisional Patent Application Ser. No. 62/275,837, entitled "Substrate Processing System with Multiple Injection Points and Dual Injector" and filed on Jan. 7, 2016, which is hereby incorporated by reference in its entirety.

In some examples, the gas injector 142 includes a center injection location that directs gas in a downward direction and one or more side injection locations that inject gas at an angle with respect to the downward direction. In some examples, the gas delivery system 150-1 delivers a first portion of the gas mixture at a first flow rate to the center injection location and a second portion of the gas mixture at a second flow rate to the side injection location(s) of the gas injector 142. In other examples, different gas mixtures are delivered by the gas injector 142. In some examples, the gas delivery system 150-1 delivers tuning gas to the gas flow channels 129 and 134 and/or to other locations in the processing chamber as will be described below.

A plasma generator 170 may be used to generate RF power that is output to the one or more inductive coils 140. Plasma 190 is generated in the upper chamber region 104. In some examples, the plasma generator 170 includes an RF generator 172 and a matching network 174. The matching network 174 matches an impedance of the RF generator 172 to the impedance of the one or more inductive coils 140. In some examples, the gas distribution device 114 is connected to a reference potential such as ground. A valve 178 and a pump 180 may be used to control pressure inside of the lower and upper chamber regions 102, 104 and to evacuate reactants.

A controller 176 communicates with the gas delivery systems 150-1 and 150-2, the valve 178, the pump 180, and/or the plasma generator 170 to control flow of process gas, purge gas, RF plasma and chamber pressure. In some examples, plasma is sustained inside the dome 118 by the one or more inductive coils 140. One or more gas mixtures are introduced from a top portion of the chamber using the gas injector 142 (and/or holes 123) and plasma is confined within the dome 118 using the gas distribution device 114.

Confining the plasma in the dome 118 allows volume recombination of plasma species and effusing desired etchant species through the gas distribution device 114. In some examples, there is no RF bias applied to the substrate 126. As a result, there is no active sheath on the substrate 126 and ions are not hitting the substrate with any finite energy. Some amount of ions will diffuse out of the plasma region through the gas distribution device 114. However, the amount of plasma that diffuses is an order of magnitude lower than the plasma located inside the dome 118. Most of ions in the plasma are lost by volume recombination at high pressures. Surface recombination loss at the upper surface of the gas distribution device 114 also lowers ion density below the gas distribution device 114.

In other examples, an RF bias generator 184 is provided and includes an RF generator 186 and a matching network 188. The RF bias can be used to create plasma between the gas distribution device 114 and the substrate support or to create a self-bias on the substrate 126 to attract ions. The controller 176 may be used to control the RF bias.

The substrate support 122 includes an edge ring 192. The edge ring 192 according to the principles of the present disclosure is moveable (e.g., moveable upward and downward in a vertical direction) relative to the substrate 126, and/or the substrate support 122 is moveable upward and downward. For example, the edge ring 192 and/or the substrate support 122 may be controlled via one or more actuators responsive to the controller 176 as described below in more detail.

The substrate 126 includes one or more contact fingers 194 positioned to engage the edge ring 192. For example, raising and lowering the edge ring 192 and/or the substrate support 122 selectively causes the edge ring 192 to engage the contact fingers 194 as described below in more detail. A measurement device (e.g., an SR device, or any other suitable device for directing a signal and sensing the reflected signal) 196 is arranged to direct an SR signal at a surface of the substrate 126. The SR signal is reflected and received by a sensor (e.g., a CCD device, a photodiode, etc.) 198. Alignment of the SR device 196 relative to the substrate support 122 may be calculated by monitoring signal intensity of the reflected SR signal as a position of the substrate 126 (e.g., an orientation of the substrate 126 relative to the substrate support 122 and the SR device 196) is adjusted.

Figure 2A:
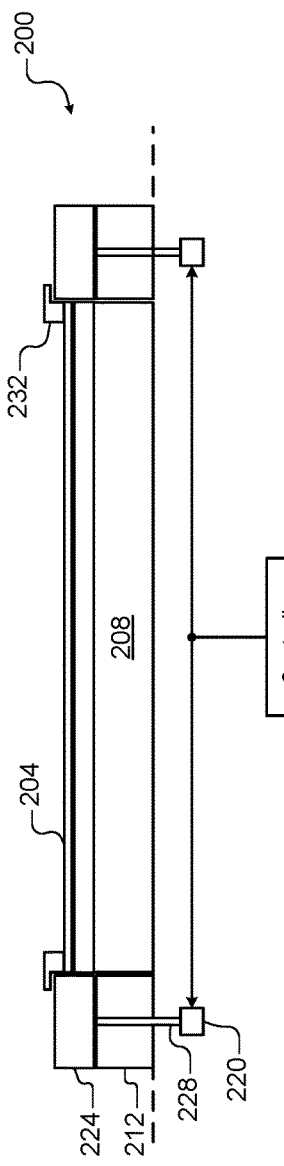
FIG. 2A shows an example edge ring in a lowered position according to the present disclosure.
Figure 2B:
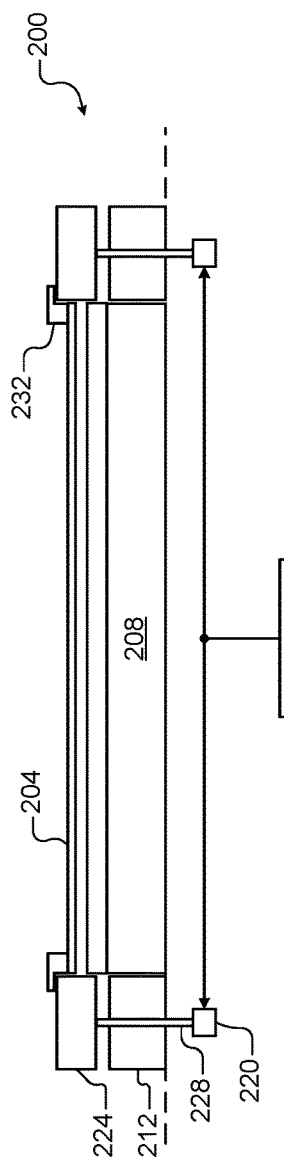
FIG. 2B shows an example edge ring in a raised position according to the present disclosure.
Figure 2C:
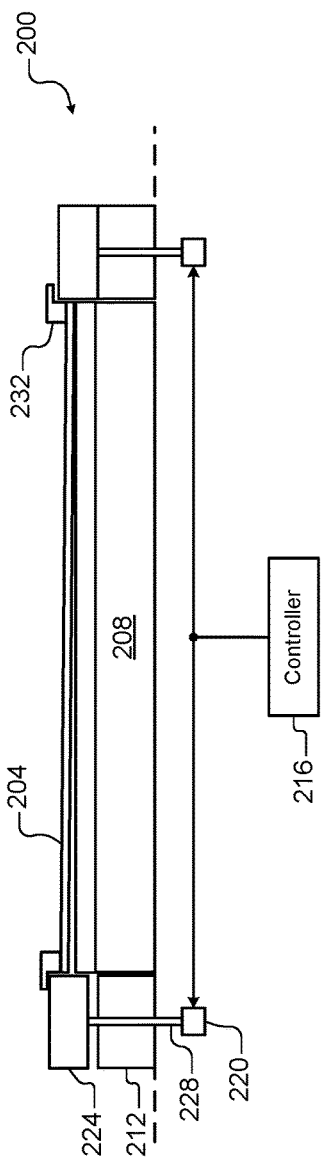
FIG. 2C shows an example edge ring in a tilted position according to the present disclosure.

Referring now to FIGS. 2A, 2B, and 2C, example substrate supports 200 having respective test substrates or substrates 204 arranged thereon according to the principles of the present disclosure are shown. The substrate supports 200 may each include a base or pedestal having an inner portion (e.g., corresponding to an ESC) 208 and an outer portion 212. In examples, the inner portion 208 may be independent from, and moveable in relation to, the outer portion 212 (i.e., in examples where the inner portion 208 is configured to be raised and/or lowered). A controller 216 communicates with one or more actuators 220 to selectively raise and lower edge ring 224. For example only, the edge ring 224 is shown in a fully lowered position in FIG. 2A and in example raised positions in FIGS. 2B and 2C. As shown in the examples, the actuators 220 correspond to pin actuators configured to selectively extend and retract pins 228 in a vertical direction. Other suitable types of actuators may be used in other examples. For example, the actuators 220 may correspond to motors configured to engage threads of the respective pins 228 to raise and lower the pins 228 in a stepwise fashion. For example only, the edge ring 224 corresponds to a ceramic or quartz edge ring.

The test substrate 204 includes one or more contact fingers 232. Although two contact fingers 232 are shown, in examples the test substrate 204 may include one, two, three, or more contact fingers 232. In FIG. 2B, the controller 216 is shown communicating with the actuators 220 to raise the entire edge ring 224. For example, the controller 216, actuators 220, and pins 228 may be configured such that only the entire edge ring 224 is raised and lowered, or the controller 216 may be configured to control the pins 228 individually. Accordingly, the test substrate 204 is substantially flat with respect to (i.e., parallel to) the substrate support 200. Conversely, in FIG. 2C, the controller 216 is shown communicating with only one of the actuators 220 to raise respective one of the pins 228 and only a portion of the edge ring 224. Accordingly, the test substrate 204 is tilted with respect to the substrate support 200.

Although as shown in FIG. 2C a left side of the test substrate 204 is raised, the right side of the test substrate 204 can be raised in a similar manner. Accordingly, the orientation of the test substrate 204 can be adjusted from a first position where the left side of the test substrate 204 is raised and the right side of the test substrate 204 is lowered to a second position where the left side of the test substrate 204 is lowered and the right side of the test substrate 204 is raised while the SR signal is monitored (e.g., sampled) at a plurality of positions therebetween.

In examples where the substrate support 200 only includes one of the actuators 220 and the respective pin 228, the test substrate 204 can be rotated and arranged in different positions to align the contact finger 232 with different portions of the edge ring 224.

Figure 3A:
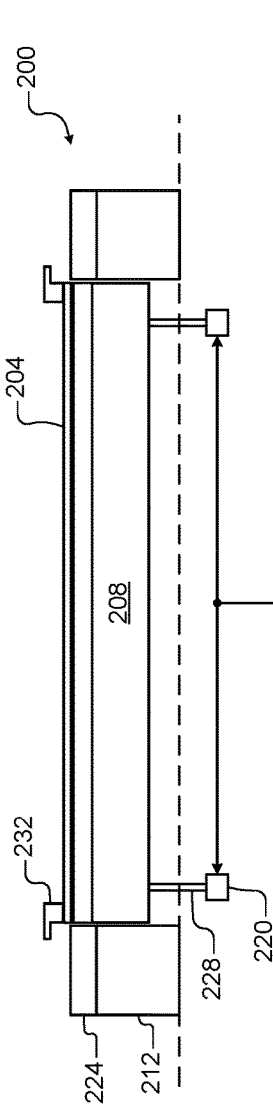
FIG. 3A shows an example substrate support in a raised position according to the present disclosure.
Figure 3B:
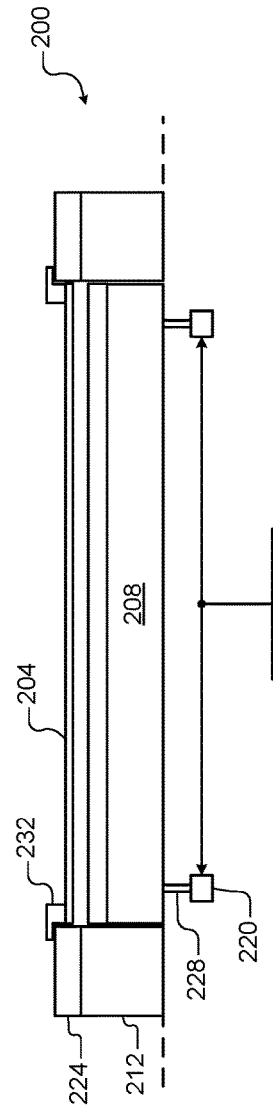
FIG. 3B shows an example test substrate arranged on a substrate support in a lowered position according to the present disclosure.
Figure 3C:
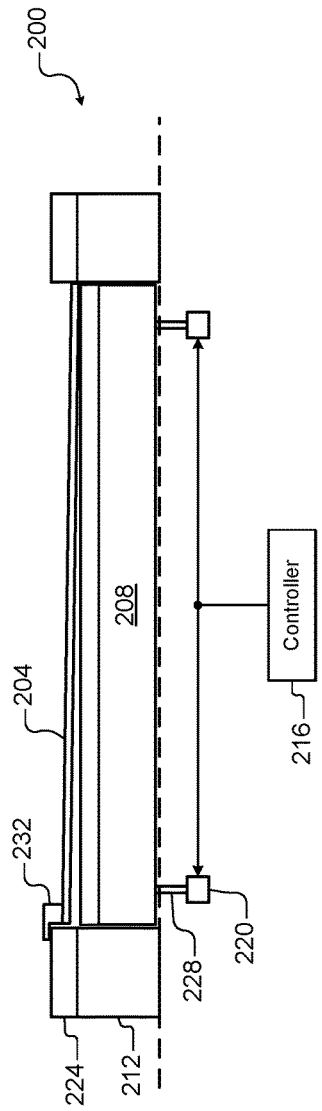
FIG. 3C shows another example test substrate arranged on a substrate support in a lowered position according to the present disclosure.

In another example as shown in FIGS. 3A, 3B, and 3C, the absolute height of the edge ring 224 (and/or the outer portion 212 that the edge ring 224 is mounted on) may be fixed relative to a bottom surface of the chamber. Instead, the inner portion 208 (e.g., the ESC) is moveable relative to the edge ring 224. Accordingly, the controller 216 may communicate with the actuators 220 to raise and lower the inner portion 208 relative to the edge ring 224 to adjust the height of the edge ring 224 relative to the substrate support 200. The inner portion 208 is shown in a raised position in FIG. 3A and in example lowered positions in FIGS. 3B and 3C. Accordingly, in examples where the test substrate 204 includes a plurality of the contact fingers 232 (e.g., as shown in FIG. 3B), the entire test substrate 204 is supported by the edge ring 224 and is substantially flat with respect to (i.e., parallel to) the substrate support 200. Conversely, in examples where the test substrate 204 only includes only one of the contact fingers 232 (e.g., as shown in FIG. 3C), a portion of the test substrate 204 corresponding to the contact finger 232 is supported by the edge ring 224, and the test substrate 204 is tilted with respect to the substrate support 200.

The test substrate 204 can be rotated and arranged in different positions to align the contact finger 232 with different portions of the edge ring 224. For example, as shown in FIG. 3C the test substrate 204 is arranged such that the contact finger 232 is on a left side of the substrate support 200, and therefore the test substrate 204 is raised on the left side of the substrate support. However, the test substrate 204 can be raised on a right side of the substrate support 200 in a similar manner. For example, the test substrate 204 can be rotated such that the contact finger 232 is on the right side of the substrate support 200. The orientation of the test substrate 204 can be adjusted from a first position where the test substrate 204 is raised on the left side of the substrate support 200 and lowered on the right side of the substrate support 200 to a second position where the test substrate 204 is substantially flat (i.e., both sides of the test substrate 204 are lowered). The test substrate 204 is then rotated such that that the contact finger 232 is on the right side of the substrate support 200, and the orientation of the test substrate 204 is adjusted from the second position to a third position where the test substrate 204 is raised on the right side of the substrate support 200 and lowered on the left side of the substrate support 200. The SR signal is monitored (e.g., sampled) at a plurality of positions as the test substrate 204 is adjusted from the first position to the third position.

In this manner, the controller 216 is configured to monitor characteristics of the reflected SR signal (e.g., signal intensity of the SR signal) as the orientation of the test substrate 204 is adjusted through a plurality of positions. Further, the controller 216 may determine (and indicate to a user via an LED, graphical interface, etc.) when the SR requires realignment. The controller 216 can perform the measurement of the alignment of the SR via the above methods periodically, when prompted by a user, etc.

FIGS. 4A and 4B show plan views of example test substrates 260 and 264. In FIG. 4A, the test substrate 260 includes a plurality (e.g., three) contact fingers 268. In FIG. 4B, the test substrate 264 includes only one of the contact fingers 268. One or more of the contact fingers 268 may include a notch 272. The notch 272 may be used to position the test substrates 260 and 264 with a desired alignment with respect to the substrate support. For example, the position of the test substrates 260 and 264 can be determined by detecting the notch 272 (e.g., using a camera or other image sensing device) and calculating the alignment of the test substrates 260 and 264 accordingly.

FIGS. 5A, 5B, and 5C show an example substrate support 300 having a moveable edge ring 304. A test substrate 308 having a contact finger 312 is arranged on the substrate support 300. An SR 316 and a sensor (e.g., a photodiode) 320 are arranged to direct an SR signal at an upper surface of the test substrate 308 and sense the reflected SR signal. In FIG. 5A, the SR 316 is shown having a desired (e.g., perfect) alignment for example only. Accordingly, the vector of the SR signal is aligned with (i.e., parallel to) the normal vector of the test substrate 308 (and, correspondingly, the normal vector of the substrate support 300).

In FIG. 5B, the SR 316 is shown out of alignment with the test substrate 308 arranged in a flat position. In FIG. 5C, the test substrate 308 is shown in a first tilted position. In FIG. 5D, the test substrate 308 is shown in a second tilted position. The edge ring 304 is adjusted to adjust the orientation of the test substrate 308 from the first tilted position to the second tilted position while the reflected SR signal is sensed and monitored by the controller 216.

In one example, the controller 216 determines the SR signal intensity as a function of the projection of the normal vector of the test substrate 308 as the orientation of the test substrate 308 is adjusted. For example, as the test substrate 308 is adjusted, the normal vector shifts over a range in each of the x and y directions, and the SR signal intensity varies accordingly (e.g., according to a function SR(x, y)). The controller 216 identifies an optimal SR signal intensity (e.g., $SR_o(x_o, y_o)$) according to a position $x_o$, $y_o$ of the normal vector where the optimal SR signal intensity occurs (i.e., corresponding to a position of the test substrate 308 where the optimal SR signal intensity occurs).

With the optimal SR signal intensity $SR_o(x_o, y_o)$ thus identified with the normal vector of the test substrate 308 at a position $x_o$, $y_o$, the alignment of the SR 316 can be adjusted accordingly (e.g., via thumbscrews or other mechanical methods) to achieve the optimal SR signal intensity with the test substrate 308 in the substantially flat position. For example, the test substrate 308 is first adjusted to the substantially flat position, and the alignment of the SR 316 can be manually adjusted until the optimal SR signal intensity is achieved. In one example, the SR signal intensity with the test substrate 308 in the substantially flat position may be identified as an original SR signal intensity.

The controller 216 then monitors the reflected SR signal as the SR 316 is adjusted over a range of positions an identifies and adjusted SR position corresponding to the optimal SR signal intensity within that range. For example, the adjusted SR position ($\Delta xSR$, $\Delta ySR$), may be defined as ($\Delta xSR$, $\Delta ySR$) $=f(\Delta\theta 1, \Delta\theta 2)$, where $\Delta\theta 1$ and $\Delta\theta 2$ correspond to deviations of respective first and second thumbscrews from their original positions (i.e., corresponding to position of the SR 316 and the original signal intensity).

The original SR signal intensity may correspond to a position on an isocline curve with other SR signal intensities SR(x, y). The controller 216 correlates SR signal intensities to positions of the SR 316 (and the corresponding thumbscrew positions) as the SR 316 is adjusted through various positions (e.g., by rotating the thumbscrews). The controller 216 may be configured to calculate the isocline curve according to these correlations, calculate a numerical Jacobian representation of the SR signal intensities, and/or perform other mathematical functions to identify an SR position and respective thumbscrew positions corresponding to the optimal SR signal intensity. The controller 216 may provide feedback (e.g., via a graphical interface, LEDs, etc.) to a user indicating which direction to rotate the thumbscrews (or other adjustment mechanisms) until the SR 316 is in a position corresponding to the optimal SR signal intensity.

Figure 6:
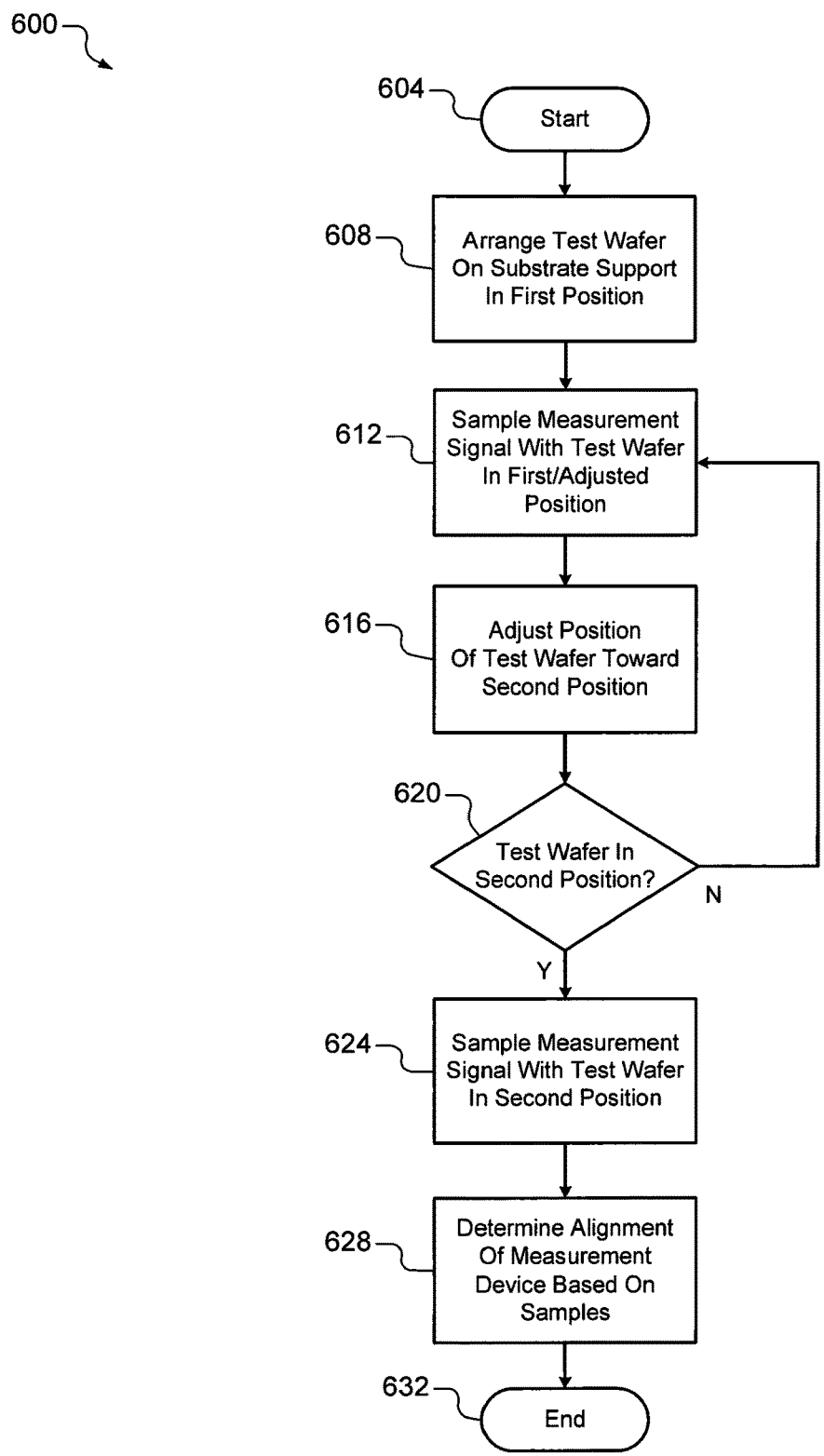
FIG. 6 illustrates steps of an example method for determining alignment of a measurement device in a substrate processing system according to the present disclosure.

Referring now to FIG. 6, an example method 600 for determining alignment of a measurement device in a substrate processing system begins at 604. At 608, a test or dummy substrate (e.g., the test substrate 204) is arranged on a substrate support having a moveable edge ring and/or inner portion as described above in FIGS. 1-3. For example, the test substrate includes one or more contact fingers arranged around and extending outward from an edge of the test substrate. At 612, the method 600 (e.g., the controller 216, the SR 316, and the sensor 320) monitors and samples a measurement signal (e.g., a SR signal) reflected from a surface of the test substrate with the test substrate in a first position. For example, the first position may correspond to a completely raised or completely lowered position, a substantially flat position, etc.

At 616, the method 600 (e.g., the controller 216) adjusts the test substrate from the first position toward a second position. For example, the controller 216 adjusts the test substrate by raising or lowering a portion of the edge ring and/or the inner portion of the substrate support. At 620, the method 600 (e.g., the controller 216) determines whether the test substrate is in the second position. If true, the method 600 continues to 624 to sample the measurement signal with the test substrate in the second position. If false, the method 600 continues to 612 to sample the measurement signal with the test substrate in the adjusted position. Accordingly, the method 600 samples the measurement signal with the test substrate in a plurality of positions between the first position and the second position. The method 600 may repeat 612, 616, and 620 while raising/lowering different portions of the edge ring to sample the measurement signal with the test substrate tilted in different directions relative to the substrate support and the measurement device, and/or while raising/lower the edge ring with the test substrate rotated in different positions.

At 628, the method 600 (e.g., the controller 216) determines an alignment of the measurement device based on characteristics of the sampled measurement signal at the plurality of positions. For example, the controller 216 may determine signal intensities of the measurement signal at respective ones of the plurality of positions to determine an optimal signal intensity of the measurement signal at a corresponding position of the test substrate. A difference between the position of the test substrate when the measurement signal is at the optimal intensity and a substantially flat position of the test substrate is indicative of the alignment of the measurement device. In other words, if the optimal signal intensity occurs at a position that is not the substantially flat position of the test substrate, it may be presumed that the measurement device is not aligned properly. The method 600 ends at 632.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language) or XML (extensible markup language), (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective C, Haskell, Go, SQL, R, Lisp, Java®, Fortran, Perl, Pascal, Curl, OCaml, Javascript®, HTML5, Ada, ASP (active server pages), PHP, Scala, Eiffel, Smalltalk, Erlang, Ruby, Flash®, Visual Basic®, Lua, and Python®.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A substrate support in a substrate processing system, the substrate support comprising:
   an inner portion arranged to support a substrate;
   an edge ring surrounding the inner portion; and
   a controller configured to
   selectively cause the edge ring to engage the substrate and tilt the substrate by controlling at least one actuator to at least one of (i) raise and lower the edge ring and (ii) raise and lower the inner portion of the substrate support,
   receive a measurement signal, wherein the measurement signal is indicative of a monitored signal reflected from a surface of the substrate as the substrate is tilted, and
   determine an alignment of a measurement device in the substrate processing system based on the measurement signal indicative of the monitored signal reflected from the surface of the substrate when the substrate is tilted.

2. The substrate support of claim 1, wherein the substrate includes at least one contact finger extending outward from an edge of the substrate, and wherein the at least one contact finger is arranged to engage the edge ring.

3. The substrate support of claim 2, wherein the contact finger is arranged to engage an inner diameter of the edge ring.

4. The substrate support of claim 1, wherein, to determine the alignment of the measurement device, the controller determines an intensity of the signal reflected from the surface of the substrate.

5. The substrate support of claim 1, wherein the measurement device includes a spectral reflectometer (SR) arranged above the substrate support.

6. The substrate support of claim 1, further comprising:
a plurality of pins positioned to support the edge ring; and
the at least one actuator, wherein the at least one actuator includes a plurality of actuators responsive to the controller and arranged to selectively raise and lower respective ones of the plurality of pins.

7. The substrate support of claim 1, further comprising:
the at least one actuator, wherein the at least one actuator is responsive to the controller and arranged to selectively raise and lower the inner portion.

8. A method for determining alignment of a measurement device in a substrate processing system, the method comprising:
arranging a substrate on an inner portion of a substrate support;
selectively causing an edge ring arranged around the inner portion of the substrate support to engage the substrate and tilt the substrate by at least one of (i) raising and lowering the edge ring and (ii) raising and lowering the inner portion of the substrate support;
receiving a measurement signal, wherein the measurement signal is indicative of a monitored signal reflected from a surface of the substrate as the substrate is tilted; and
determining the alignment of the measurement device based on the measurement indicative of the monitored signal reflected from the surface of the substrate when the substrate is tilted.

9. The method of claim 8, further comprising providing at least one contact finger extending outward from an edge of the substrate, wherein the at least one contact finger is arranged to engage the edge ring.

10. The method of claim 9, further comprising arranging the substrate such that the contact finger is positioned to engage an inner diameter of the edge ring.

11. The method of claim 8, wherein determining the alignment of the measurement device includes determining an intensity of the signal reflected from the surface of the substrate.

12. The method of claim 8, wherein the measurement device includes a spectral reflectometer (SR) arranged above the substrate support.

13. The method of claim 8, further comprising selectively raising and lowering, using at least one actuator, respective ones of a plurality of pins positioned to support the edge ring.

14. The method of claim 8, further comprising selectively raising and lowering the inner portion using at least one actuator and one or more pins positioned to support the inner portion.

* * * * *